US012789284B2

(12) United States Patent
Walker et al.

(10) Patent No.: US 12,789,284 B2
(45) Date of Patent: Nov. 10, 2026

(54) ULTRASONIC WELDING SYSTEMS, AND SONOTRODES FOR ULTRASONIC WELDING SYSTEMS

(71) Applicant: Kulicke and Soffa Industries, Inc., Fort Washington, PA (US)

(72) Inventors: Todd Walker, Huntington Beach, CA (US); Henri Seppaenen, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 19/071,983

(22) Filed: Mar. 6, 2025

(65) Prior Publication Data

US 2025/0289074 A1 Sep. 18, 2025

Related U.S. Application Data

(60) Provisional application No. 63/669,740, filed on Jul. 11, 2024, provisional application No. 63/565,931, filed on Mar. 15, 2024.

(51) Int. Cl.
*B23K 20/10* (2006.01)
*H10W 72/00* (2026.01)

(52) U.S. Cl.
CPC ........... *B23K 20/106* (2013.01); *H10W 72/00* (2026.01)

(58) Field of Classification Search
None
See application file for complete search history.

(56) References Cited

U.S. PATENT DOCUMENTS 3,623,649 A * 11/1971 Keisling ............. H10W 70/093 228/111.5
4,776,509 A * 10/1988 Pitts ..................... B23K 20/106 228/179.1
5,193,732 A * 3/1993 Interrante .............. B23K 20/10 228/1.1
5,390,844 A * 2/1995 Distefano ........... H10P 72/0444 228/49.5
5,816,472 A * 10/1998 Linn .................... B23K 20/004 228/1.1
(Continued)

FOREIGN PATENT DOCUMENTS

EP 2219220 B1 3/2015
JP 60-240137 11/1985
(Continued)

OTHER PUBLICATIONS

International Search report for PCT Application No. PCT/US2025/018456, completed Jun. 18, 2025.

*Primary Examiner* — Devang R Patel
(74) *Attorney, Agent, or Firm* — Christopher M. Spletzer, Sr.

(57) ABSTRACT

A sonotrode configured for use in an ultrasonic welding system is provided. The sonotrode includes a body portion terminating at a tip portion, the tip portion including a working surface. The working surface defines an aperture configured to hold a conductive pin during an ultrasonic welding process. The working surface also defines a plurality of linear depressions. Each of the plurality of linear depressions follows a path that does not intersect the aperture.

20 Claims, 18 Drawing Sheets

(56) References Cited

U.S. PATENT DOCUMENTS

| | | | | | |
|---|---|---|---|---|---|
| 5,868,301 | A * | 2/1999 | Distefano | H10P 72/0444 228/1.1 |
| 7,793,815 | B2 * | 9/2010 | Shimizu | B29C 66/8322 228/110.1 |
| 8,651,163 | B1 * | 2/2014 | Widhalm | B23K 20/106 156/580.2 |
| 8,801,882 | B2 * | 8/2014 | Regenberg | B29C 66/81433 156/580.2 |
| 10,882,134 | B2 * | 1/2021 | Luechinger | B23K 20/10 |
| 10,981,245 | B2 * | 4/2021 | Wang | B29C 66/7212 |
| 11,364,565 | B2 | 6/2022 | Luechinger et al. | |
| 11,850,676 | B2 * | 12/2023 | Copperthite | B23K 20/002 |
| 12,070,814 | B2 | 8/2024 | Copperthite et al. | |
| 12,370,620 | B2 * | 7/2025 | Sharma | B23K 20/002 |
| 2003/0062110 | A1 * | 4/2003 | Urlaub | B06B 3/02 156/73.1 |
| 2021/0358873 | A1 | 11/2021 | Han et al. | |
| 2024/0351132 | A1 | 10/2024 | Sharma et al. | |
| 2024/0359255 | A1 | 10/2024 | Copperthite et al. | |

FOREIGN PATENT DOCUMENTS

| | | | | |
|---|---|---|---|---|
| JP | 2001246670 | A * | 9/2001 | B29C 66/8221 |
| JP | 2011-110839 | | 6/2011 | |
| JP | 2011110839 | A * | 6/2011 | B29C 66/5326 |
| JP | 2013-038257 | | 2/2013 | |
| WO | 2024/220203 | | 10/2024 | |

* cited by examiner

ULTRASONIC WELDING SYSTEMS, AND SONOTRODES FOR ULTRASONIC WELDING SYSTEMS

CROSS-REFERENCE TO RELATED APPLICATIONS

This application claims the benefit of U.S. Provisional Application No. 63/565,931, filed Mar. 15, 2024, and U.S. Provisional Application No. 63/669,740, filed Jul. 11, 2024, the contents of both of which are incorporated herein by reference.

FIELD

The invention relates to the ultrasonic welding, and more particularly, to improved sonotrodes for use in ultrasonic welding systems, such as ultrasonic welding systems for conductive pin welding.

BACKGROUND

Ultrasonic energy is widely used in forming interconnections between two or more materials. For example, wire bonding machines (e.g., ball bonding machines, wedge bonding machines, ribbon bonding machines, etc.) are used to bond a wire or ribbon to a bonding location. Wire bonding utilizes relatively low levels of energy (e.g., bond force, ultrasonic energy, etc.). Exemplary wire bonding machines are marketed by Kulicke and Soffa Industries, Inc. of Fort Washington, Pennsylvania.

Certain applications involve joining of materials other than wire. Welding has been considered for such applications. Ultrasonic welding is also a widely used technology. Ultrasonic welding may use an ultrasonic converter (e.g., carrying a sonotrode) for converting electrical energy into mechanical movement/scrub (e.g., linear movement/scrub, torsional movement/scrub, etc.). However, existing ultrasonic welding technology and equipment is limited in its ability to provide solutions that can satisfy market demand in terms of cost, operational efficiency, flexibility, portability, and related factors.

U.S. Pat. No. 10,882,134 (entitled "Ultrasonic Welding Systems and Methods of Using the Same"), U.S. Pat. No. 11,364,565 (entitled "Ultrasonic Welding Systems and Methods of Using the Same"), and U.S. Pat. No. 11,850,676 (entitled "Ultrasonic Welding Systems, Methods of Using the Same, and Related Workpieces Including Welded Conductive Pins"), U.S. Pat. No. 12,070,814 (entitled "Ultrasonic Welding Systems, Methods of Using the Same, and Related Workpieces Including Welded Conductive Pins"), U.S. Patent Application Publication No. 2024/0359255 (entitled "Ultrasonic Welding Systems, Methods of Using the Same, and Related Workpieces Including Welded Conductive Pins"), U.S. Patent Application Publication No. 2024/0351132 (entitled "Ultrasonic Welding Systems for Conductive Pins, and Related Methods"), International Patent Publication No. WO2024/0220203 (entitled "Ultrasonic Welding Systems, Sonotrodes and Conductive Pins for Such Systems, and Related Methods and Workpieces"), assigned to Kulicke and Soffa Industries, Inc., relate to improvements in ultrasonic welding technology, and are incorporated by reference in their entirety.

Still, improvements are needed in connection with specific applications of ultrasonic welding, including ultrasonic pin welding. For example, in ultrasonic pin welding, unwelded material of conductive pins may form undesired "whiskers" (e.g., long strands of unwelded material), where such whiskers may result in short circuiting in a workpiece. Thus, it would be desirable to provide improved sonotrodes, and ultrasonic welding systems including such sonotrodes, configured for use in connection with ultrasonic pin welding.

SUMMARY

According to an exemplary embodiment of the invention, a sonotrode configured for use in an ultrasonic welding system is provided. The sonotrode includes a body portion terminating at a tip portion, the tip portion including a working surface. The working surface defines an aperture configured to hold a conductive pin during an ultrasonic welding process. The working surface also defines a plurality of linear depressions. Each of the plurality of linear depressions follows a path that does not intersect the aperture.

According to other embodiments of the invention, the sonotrode recited in the immediately preceding paragraph may have any one or more of the following features: each of the plurality of linear depressions extends across the working surface; the plurality of linear depressions collectively define a star shaped pattern; the plurality of linear depressions collectively define a plurality of V-shaped patterns around a peripheral portion of the working surface; the working surface includes a smooth portion, and the plurality of linear depressions are disposed around a peripheral portion of the working surface; the working surface further defines an annular depression between the aperture and an edge of the working surface; the body portion and the tip portion are formed from a unitary piece of material; the body portion and the tip portion are separate pieces coupled together; the tip portion includes a chamfered portion between the working surface and a terminal end of the sonotrode; and/or the chamfered portion is configured to align the conductive pin with respect to the aperture in connection with the ultrasonic welding process.

According to another exemplary embodiment of the invention, a sonotrode configured for use in an ultrasonic welding system is provided. The sonotrode includes a body portion terminating at a tip portion, the tip portion including a working surface. The working surface defines an aperture configured to hold a conductive pin during an ultrasonic welding process. The working surface defines an annular depression between the aperture and an edge of the working surface.

According to other embodiments of the invention, the sonotrode recited in the immediately preceding paragraph may have any one or more of the following features: the working surface includes a roughened portion; the working surface includes a patterned portion; the working surface includes a plurality of depressions; the plurality of depressions are a plurality of linear grooves; the plurality of linear grooves are arranged in a pattern; the body portion and the tip portion are formed from a unitary piece of material; the body portion and the tip portion are separate pieces coupled together; the tip portion includes a chamfered portion between the working surface and a terminal end of the sonotrode; and/or the chamfered portion is configured to align the conductive pin with respect to the aperture in connection with the ultrasonic welding process.

According to yet another exemplary embodiment of the invention, a sonotrode configured for use in an ultrasonic welding system is provided. The sonotrode includes a body portion terminating at a tip portion, the tip portion including a working surface. The working surface defines an aperture configured to hold a conductive pin during an ultrasonic welding process. The sonotrode defines a cavity adjacent the working surface. The cavity is defined by the working surface and a peripheral wall. A pin head of the conductive pin is configured to be received by the cavity.

According to other embodiments of the invention, the sonotrode recited in the immediately preceding paragraph may have any one or more of the following features: the peripheral wall is a circular wall that surrounds the working surface; the peripheral wall extends perpendicularly from the working surface; the peripheral wall is configured to mitigate (e.g., reduce, prevent, etc.) outflow of material resulting from the ultrasonic welding process; the working surface includes a roughened portion; the working surface includes a patterned portion; the working surface includes a plurality of linear grooves; the plurality of linear grooves are arranged in a pattern; the working surface includes a plurality of protrusions; the plurality of protrusions are laser scribed protrusions; the plurality of protrusions are arranged in a plurality of concentric rings, each of the plurality of concentric rings including a portion of the plurality of protrusions; the body portion and the tip portion are formed from a unitary piece of material; the body portion and the tip portion are separate pieces coupled together; the peripheral wall is a chamfered wall between the working surface and a terminal end of the sonotrode; and/or the chamfered wall is configured to align the conductive pin with respect to the aperture in connection with the ultrasonic welding process.

According to other embodiments of the invention, ultrasonic welding systems are provided including any combination of the features recited in the immediately preceding six paragraphs, and features disclosed within this application (e.g., a support structure configured for supporting a workpiece, a weld head assembly including an ultrasonic converter for carrying a sonotrode, etc.), and/or other features within the scope of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Sonotrodes used in connection with an ultrasonic welding system (e.g., configured to ultrasonically weld, such as through torsional motion, conductive pins to a workpiece) are described herein. Certain exemplary embodiments of sonotrodes disclosed herein provide certain advantages in the mitigation of unwelded material (e.g., of conductive pins) produced in certain ultrasonic welding operations (e.g., pin welding operations). In certain applications, unwelded materials may form undesired "whiskers" which can be described as strands (e.g., long strands) of unwelded material produced in ultrasonic welding operations. Such "whiskers" can cause undesired results, such as contributing to short circuiting of the welded workpiece and/or nearby electronic components (e.g., semiconductor elements). In accordance with certain exemplary embodiments of the invention, sonotrodes are provided whereby excess welding material (which conventionally may be formed into undesired "whiskers") is mitigated (e.g., captured using an annular depression, captured using a peripheral wall, minimizing a length of any whiskers, and/or substantially containing any whiskers within the welded portion of the conductive pin).

As used herein, the term "conductive pin" is intended to refer to any conductive structure intended to be welded (e.g., ultrasonically welded) to a workpiece. The conductive pin may have a free end (after being welded to a workpiece), and a body portion of the conductive pin may extend substantially vertically from a "welded" end to the free end. The cross section of the conductive pin may be round, square, rectangular, or have any desired cross section. The term conductive pin shall also be construed to include conductive receptacles or sleeves (e.g., having a tubular shape such as a rivet), where the conductive receptacle/sleeve is ultrasonically welded to a workpiece, and configured to receive another conductive element.

As used herein, "peripheral" is intended to be interpreted broadly to mean of, at, or near an external boundary or surface (e.g., of a working surface of a sonotrode, etc.). Similarly, "circumference" and "circumferential" are intended to refer to a perimeter of a shape, such as a circle, an oval, a rectangle, and/or any other geometric shape.

As used herein, "annular" is intended to be interpreted broadly to mean a rounded shape (e.g., a circle, a ring, a ringlike shape, an anulus, an ellipse, an oval, etc.) surrounding a point (e.g., an aperture). It should be understood that any other polygonal and/or geometric shape surrounding a central point may, in certain embodiments, be referred to as "annular" within the scope of the invention.

Figure 1A:
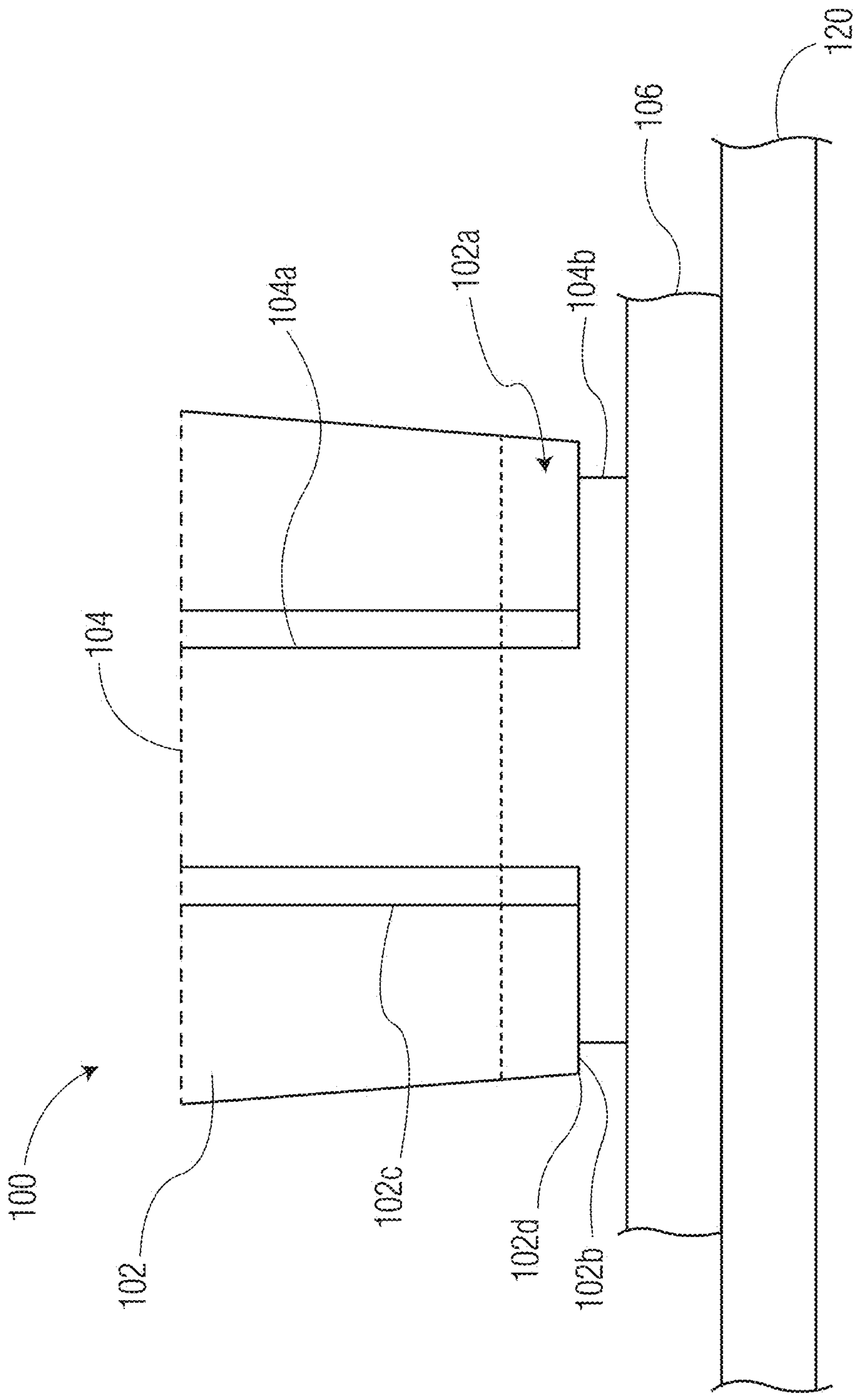
FIGS. 1A-1B are cross-sectional block diagram side views of portions of sonotrodes in connection with ultrasonic welding operations in accordance with various exemplary embodiments of the invention.
Figure 4:
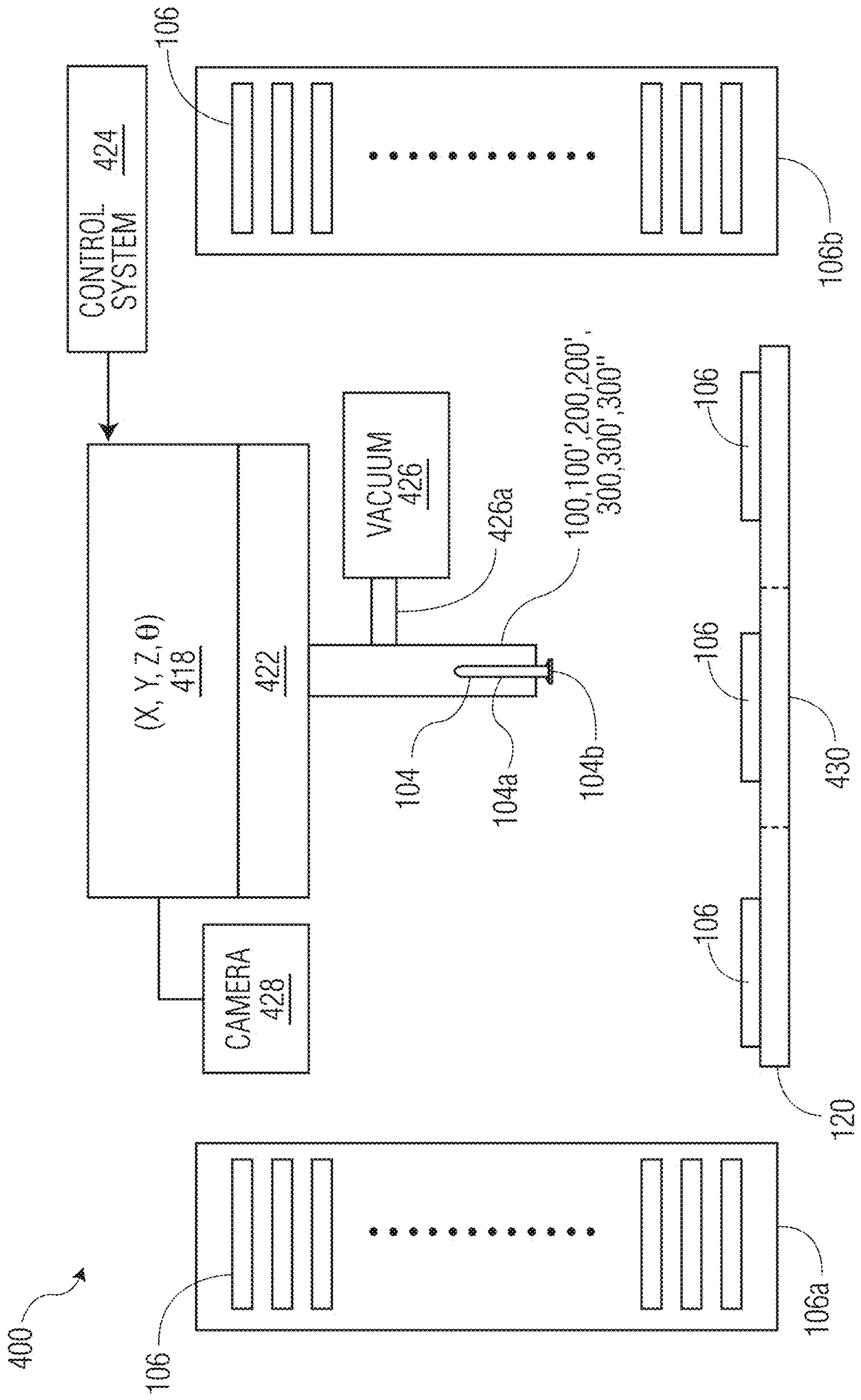
FIG. 4 is a block diagram side view of an ultrasonic welding system including a sonotrode (e.g., being one or more of the sonotrodes illustrated in FIGS. 1A-1E, FIGS. 2A-2D, and FIGS. 3A-3H) in accordance with various exemplary embodiments of the invention.

Referring now to the drawings, FIG. 1A illustrates a portion of a sonotrode 100 configured for use in an ultrasonic welding system (e.g., ultrasonic welding system 400 of FIG. 4). Sonotrode 100 is illustrated in connection with an ultrasonic welding operation, where a conductive pin 104 is being welded to a workpiece 106 (e.g., a substrate, a semiconductor element, a power module, etc.) supported by a support structure 120 (e.g., of an ultrasonic welding system). Sonotrode 100 is configured to ultrasonically weld conductive pin 104 to workpiece 106 during a welding process (e.g., an ultrasonic welding process, an ultrasonic welding operation, etc.). Conductive pin 104 is illustrated including a body portion 104*a* and a head portion 104*b*. Sonotrode 100 includes a body portion 102 including a tip portion 102*a*, where tip portion 102*a* includes a working surface 102*b*. Working surface 102*b* defines an edge 102*d* (e.g., a circumferential edge, an annular edge, etc.) and also defines (at least in part) an aperture 102*c*. Aperture 102*c* (and/or body portion 102*a*) is configured to hold conductive pin 104 during an ultrasonic welding process (e.g., by providing enough space for conductive pin 104 during an ultrasonic welding process).

Figure 1B:
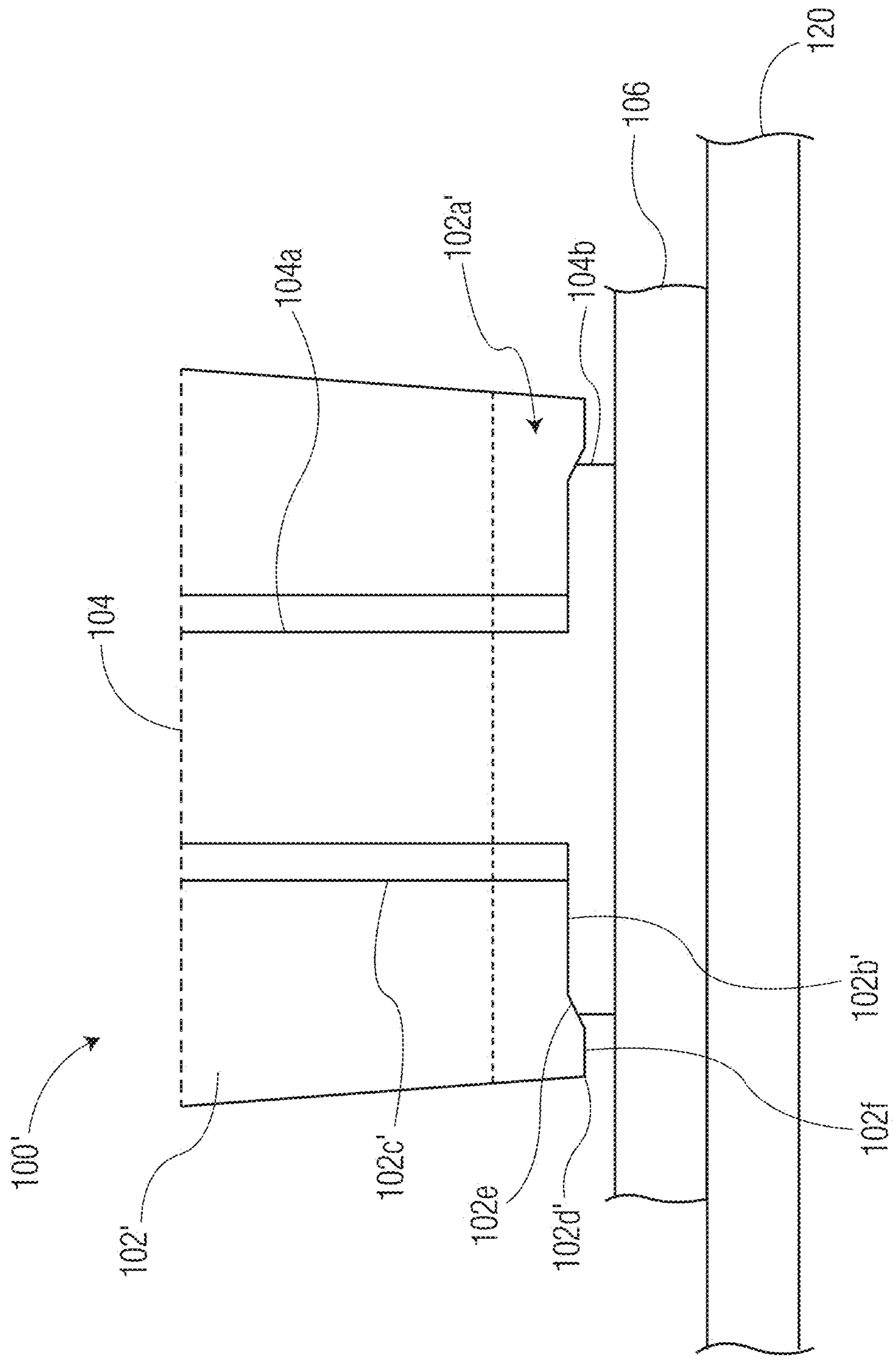

FIG. 1B illustrates a portion of a sonotrode 100' (including a body portion 102' terminating at a tip portion 102*a'*) configured for use in an ultrasonic welding system (e.g., ultrasonic welding system 400 of FIG. 4). Sonotrode 100' is similar to sonotrode 100 of FIG. 1A, except that sonotrode 100' includes a tip portion 102*a'* in lieu of tip portion 102*a*. Sonotrode 100' also includes an aperture 102*c'* and an edge 102*d'*, in lieu of aperture 102*c* and edge 102*d*. It should be understood that like reference numerals denote like elements. Tip portion 102*a'* includes a working surface 102*b'*, a chamfered portion 102*e* (e.g., a tapered portion, a filleted portion, etc.), and a terminal end 102*f* (e.g., a surface parallel to working surface 102*b'*, a non-contact portion, a portion surrounding at least a portion of conductive pin 104, etc.). Chamfered portion 102*e* is illustrated between working surface 102*b'* and terminal end 102*f*. As illustrated, when conductive pin 104 is welded using sonotrode 100', the portion of head portion 104*b* contacting chamfered portion 102*e* is deformed (e.g., crushed). Chamfered portion 102*e* may be configured to align conductive pin 104 with respect to aperture 102*c'* in connection with an ultrasonic welding process (e.g., the pin may become aligned through engagement with the peripheral wall in the presence of vacuum in the sonotrode). Chamfered portion 102*e* provides certain benefits when used in connection with an ultrasonic welding operation, such as: providing a centering function (e.g., aligning) when engaging conductive pin 104 with sonotrode 100'; providing an excess material (e.g., "whiskers") collection function; among others.

Figure 1C:
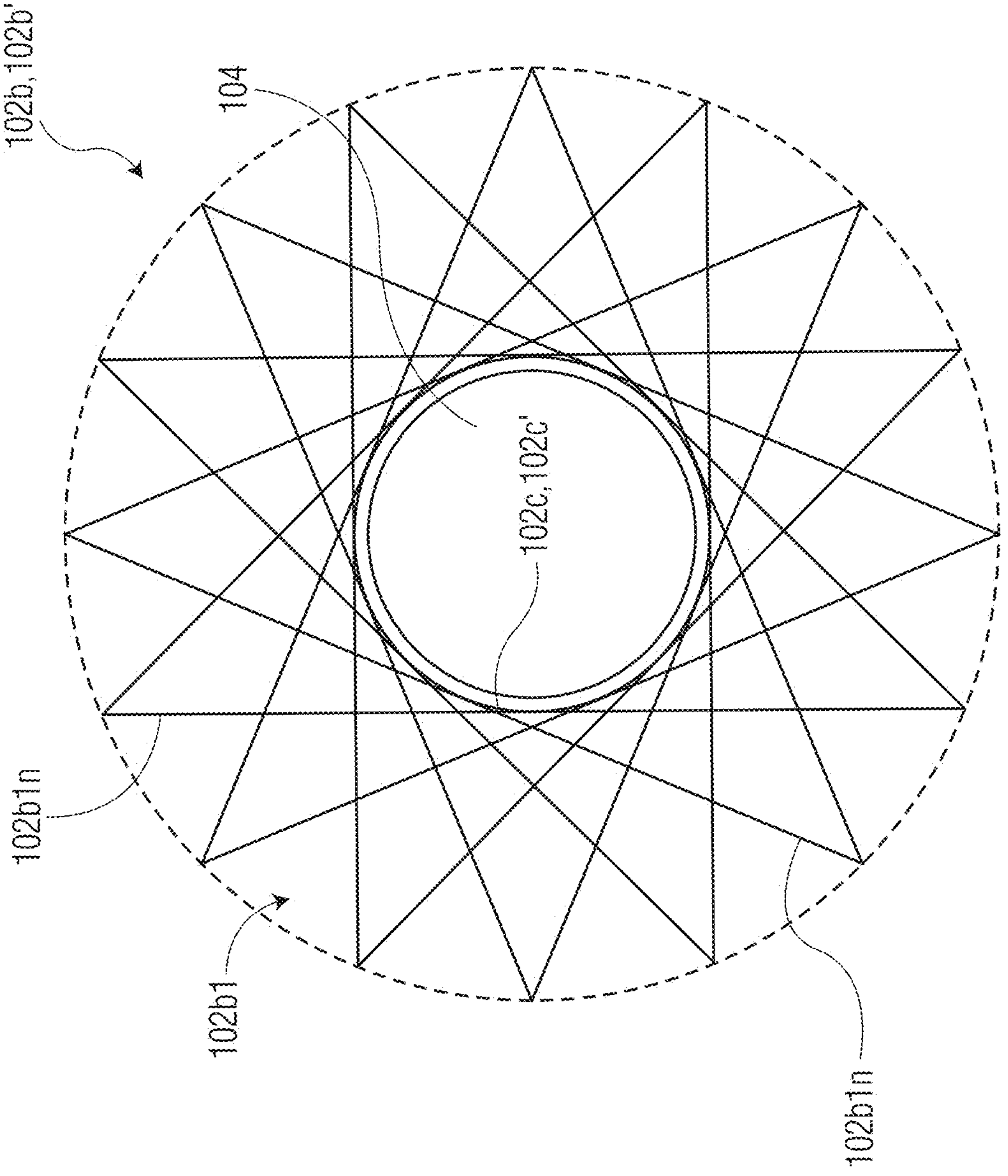
FIGS. 1C-1E are end views of the working surfaces of the sonotrodes of FIGS. 1A-1B, including various alternative working surfaces, in accordance with various exemplary embodiments of the invention.
Figure 1D:
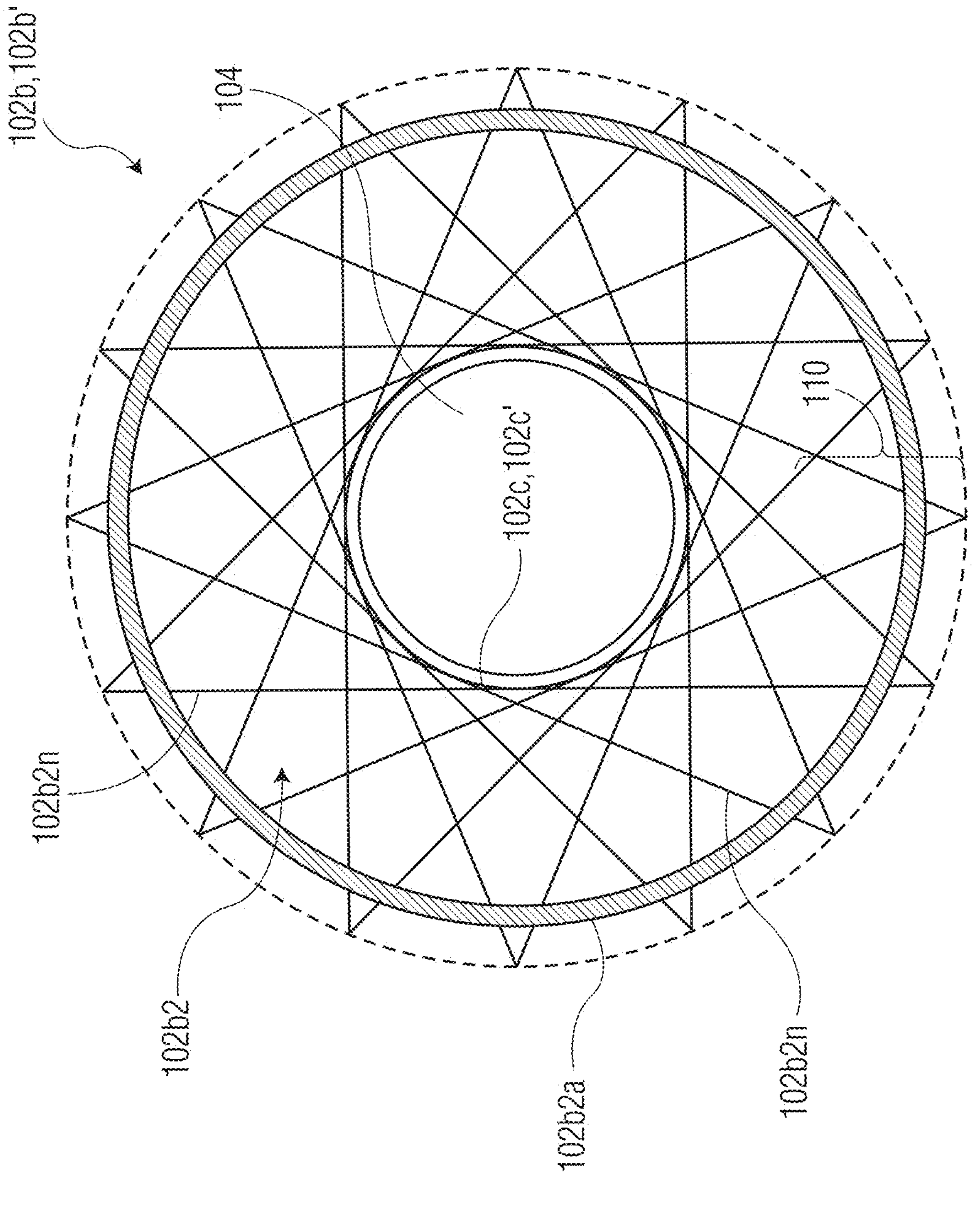
Figure 1E:
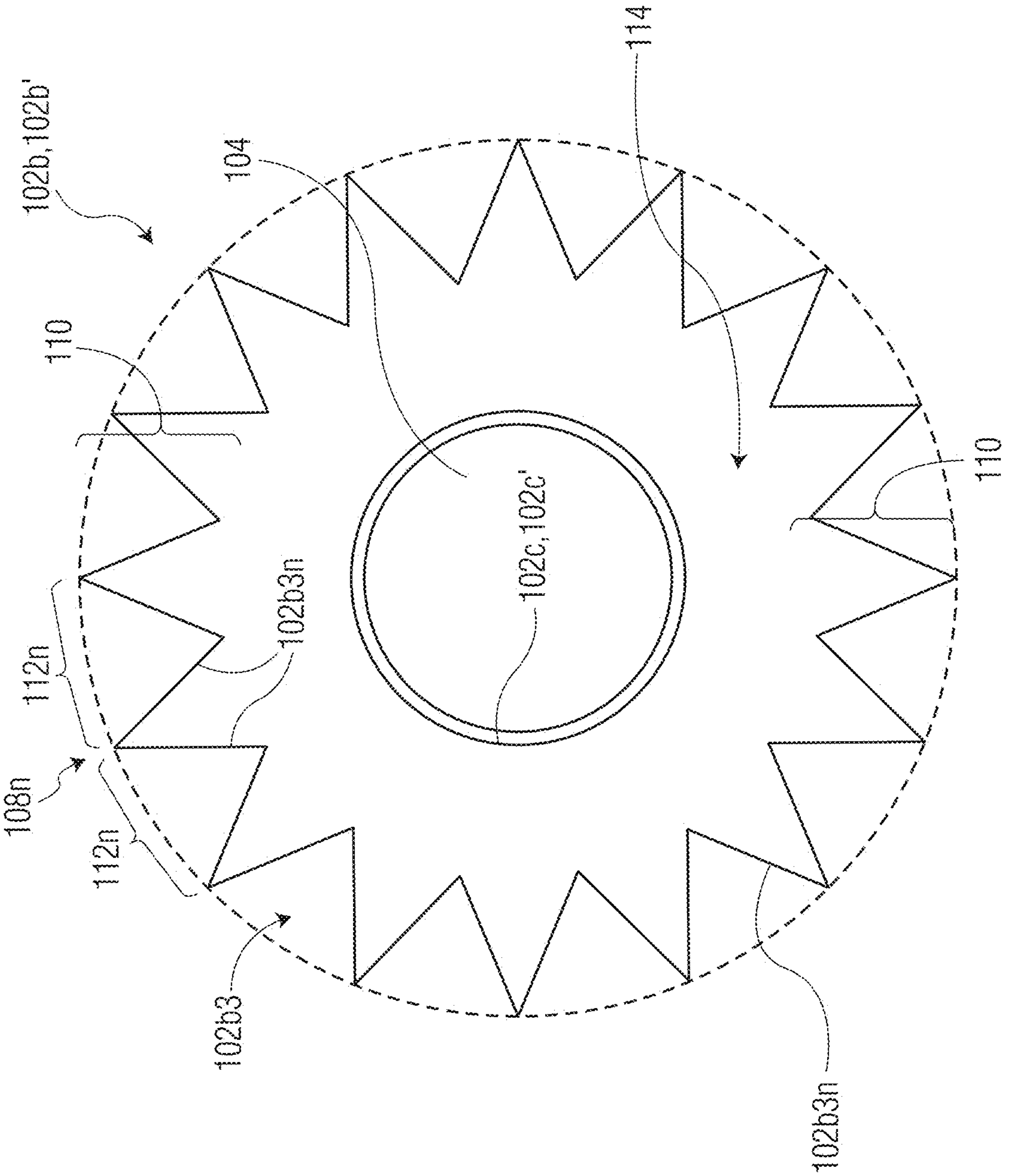

It should be understood that FIGS. 1A-1B omit certain elements that may appear in FIGS. 1C-1E. For example, an annular depression 102*b*2*a* of FIG. 1D is omitted, although such an element may be applicable to the embodiments illustrated in FIGS. 1A-1B.

FIGS. 1C-1E illustrate, respectively, working surfaces which may be disposed on embodiments of sonotrode 100 and/or sonotrode 100', namely a working surface 102*b*1, a working surface 102*b*2, and a working surface 102*b*3. It should be understood that certain repetitive or redundant reference numerals may be omitted for clarity.

Referring specifically to FIG. 1C, working surface 102*b*1 is illustrated. Working surface 102*b*1 defines a plurality of linear depressions 102*b*1*n* (in the exemplary illustration, thirty-two (32) linear depressions 102*b*1*n* are illustrated). Each of the plurality of linear depressions 102*b*1*n* (e.g., a plurality of grooves) follows a path (e.g., a linear path) that does not intersect aperture 102*c*, 102*c'*. Although each of the plurality of linear depressions 102*b*1*n* are illustrated substantially tangent to aperture 102*c*, 102*c'*, it should be understood that each of the plurality of linear depressions 102*b*1*n* may be disposed at any position (e.g., not tangent to aperture 102*c*, 102*c'*), so long as the path of each of the plurality of linear depressions 102*b*1*n* does not intersect aperture 102*c*, 102*c'*.

In the illustrated embodiment of FIG. 1C, each of the plurality of linear depressions 102*b*1*n* extends across working surface 102*b*1. The plurality of linear depressions 102*b*1*n* collectively define a star polygon (e.g., a regular star polygon) and/or a star pattern. It should be understood in certain embodiments a plurality of depressions disposed on a working surface may not be linear (e.g., where the path of each depression is defined by a curve or parabola that does not intersect aperture 102*c*, 102*c'*).

Referring now to FIG. 1D, working surface 102*b*2 is illustrated. Working surface 102*b*2 is similar to working surface 102*b*1 in many ways. Working surface 102*b*2 defines a plurality of linear depressions 102*b*2*n* (note certain reference numerals are omitted for clarity). Working surface 102*b*2 further defines annular depression 102*b*2*a* near a peripheral portion 110, between aperture 102*c*, 102*c'* and the outer edge (e.g., edge 102*d* of FIG. 1A, edge 102*d'* of FIG. 2B) of working surface 102*b*2.

Referring now to FIG. 1E, working surface 102*b*3 is illustrated. Working surface 102*b*3 defines a plurality of linear depressions 102*b*3*n* (note certain reference numerals are omitted for clarity). Each of the plurality of linear depressions 102*b*3*n* may be a groove.

Each of the plurality of linear depressions 102*b*3*n* follows a path (e.g., a linear path of an extended linear depression 102*b*3*n*) that does not intersect aperture 102*c*, 102*c'*. As illustrated, the plurality of linear depressions 102*b*3*n* includes a plurality of angle shapes 108*n* disposed around peripheral portion 110 of working surface 102*b*3. Each of the plurality of angle shapes 108*n* are illustrated as a "V"-shaped pattern. Thus, a plurality of sector-shaped patterns 112*n* (e.g., a wedge-like shape) are disposed around peripheral portion 110 of working surface 102*b*3. Working surface 102*b*3 includes a smooth portion 114 (wherein the plurality of linear depressions 102*b*3*n* are disposed around peripheral portion 110). It should be understood that smooth portion 114 may be roughened, as may be appropriate in an ultrasonic welding application. Smooth portion 114 may be defined as an area lacking any linear depressions.

In certain embodiments, working surface 102*b*3 can further define another depression, such as an annular depression (e.g., see annular depression 102*b*2*a* of FIG. 1D), between aperture 102*c*, 102*c'* and the outer edge (e.g., edge 102*d*, 102*d'*) of working surface 102*b*3.

In the exemplary embodiment of FIG. 1E, the plurality of linear depressions 102*b*3*n* are not contiguous (e.g., extending from one end/edge of working surface 102*b*3 to another end/edge of working surface 102*b*3). While the linear depressions of FIGS. 1C-1E are illustrated as straight lines or line segments, the invention is not so limited. For example, it is contemplated that curves (e.g., curved line segments, curved lines, ellipses, parabolas, and the like) that do not pass through aperture 102*c*, 102*c*' may be used in certain embodiments. Further, other depressions are contemplated such as circular depressions, zig-zag shaped depressions, etc.

Figure 2A:
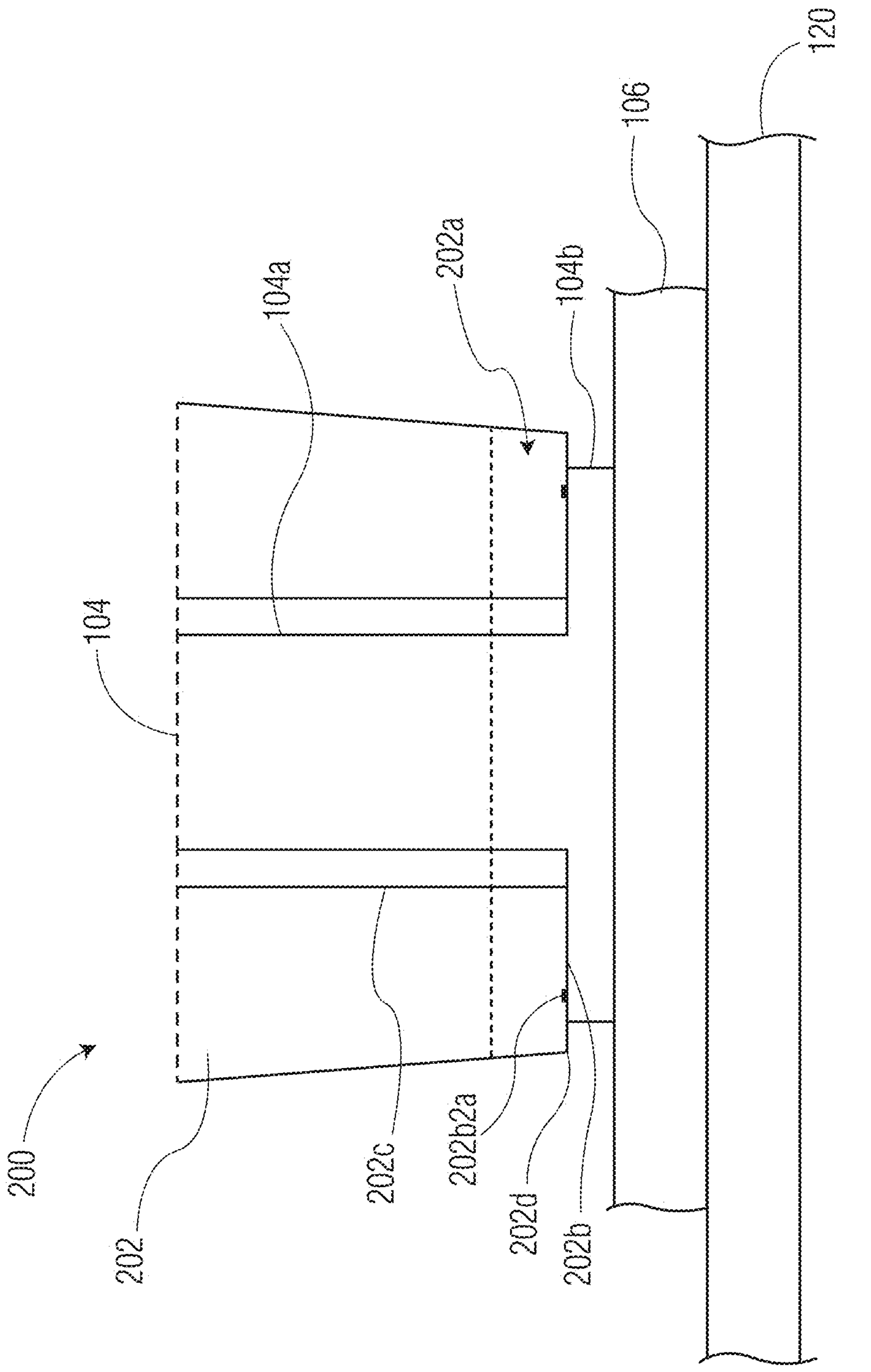
FIGS. 2A-2B are cross-sectional block diagram side views of portions of sonotrodes in connection with ultrasonic welding operations in accordance with various exemplary embodiments of the invention.

Referring now to FIG. 2A, a portion of a sonotrode 200 (including a body portion 202 terminating at a tip portion 202*a*) configured for use in an ultrasonic welding system (e.g., ultrasonic welding system 400 of FIG. 4) is illustrated. Sonotrode 200 is substantially similar to sonotrode 100 (where like elements have like reference numerals or a reference numeral beginning with a "2" in lieu of a "1"), except sonotrode 200 includes an annular depression 202*b*2*a*. The description of such elements in connection with FIGS. 1A-1E is applicable to sonotrode 200 (unless explicitly or implicitly indicated otherwise) and thus omitted for conciseness. Body portion 202 defines a working surface 202*b*, an aperture 202*c*, and an edge 202*d*.

Figure 2B:
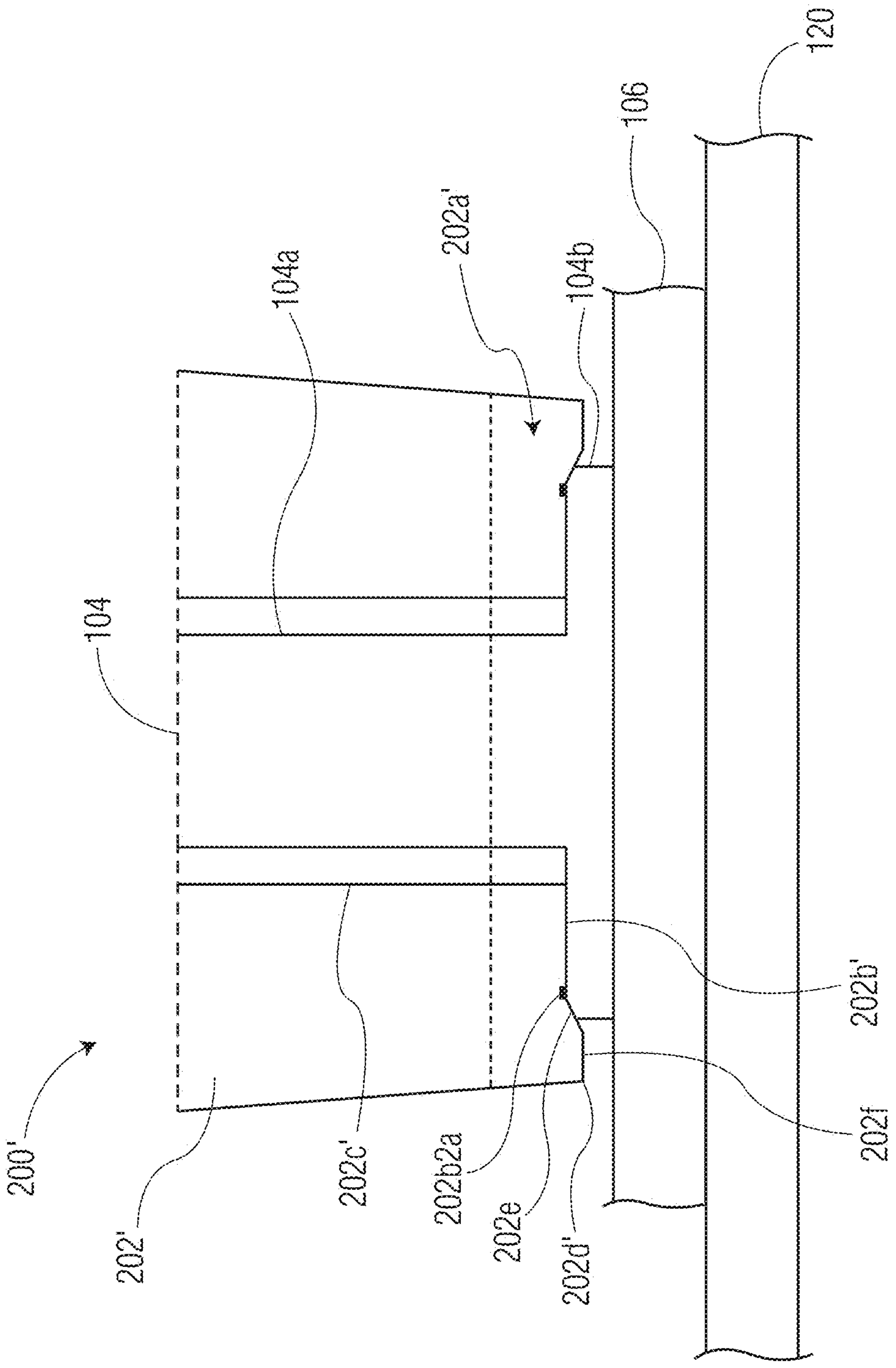

Referring now to FIG. 2B, a portion of a sonotrode 200' (including a body portion 202' terminating at a tip portion 202*a*') configured for use in an ultrasonic welding system (e.g., ultrasonic welding system 400 of FIG. 4) is illustrated. Sonotrode 200' is substantially similar to sonotrode 100' (or a reference numeral beginning with a "2" in lieu of a "1"), except sonotrode 200' includes an annular depression 202*b*2*a*. The description of such elements in connection with FIGS. 1A-1E is applicable to sonotrode 200' (unless explicitly or implicitly indicated otherwise) and thus omitted for conciseness. Body portion 202' defines a working surface 202*b*', an aperture 202*c*', an edge 202*d*', a chamfered portion 202*e*, and a terminal end 202*f* (e.g., a surface parallel to working surface 202*b*', a non-contact portion, a portion surrounding at least a portion of conductive pin 104, etc.).

Figure 2C:
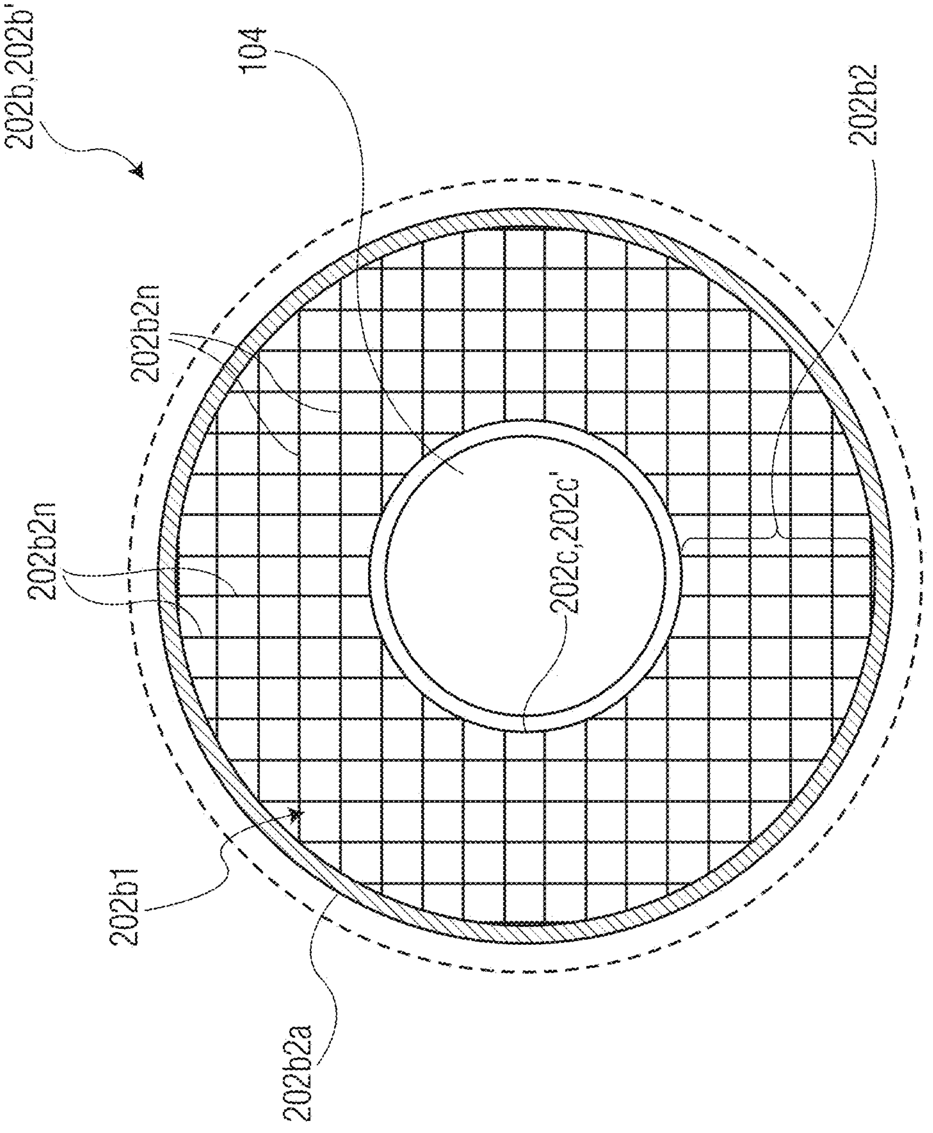
FIGS. 2C-2D are end views of the working surfaces of the sonotrodes of FIGS. 2A-2B, including various alternative working surfaces, in accordance with various exemplary embodiments of the invention.
Figure 2D:
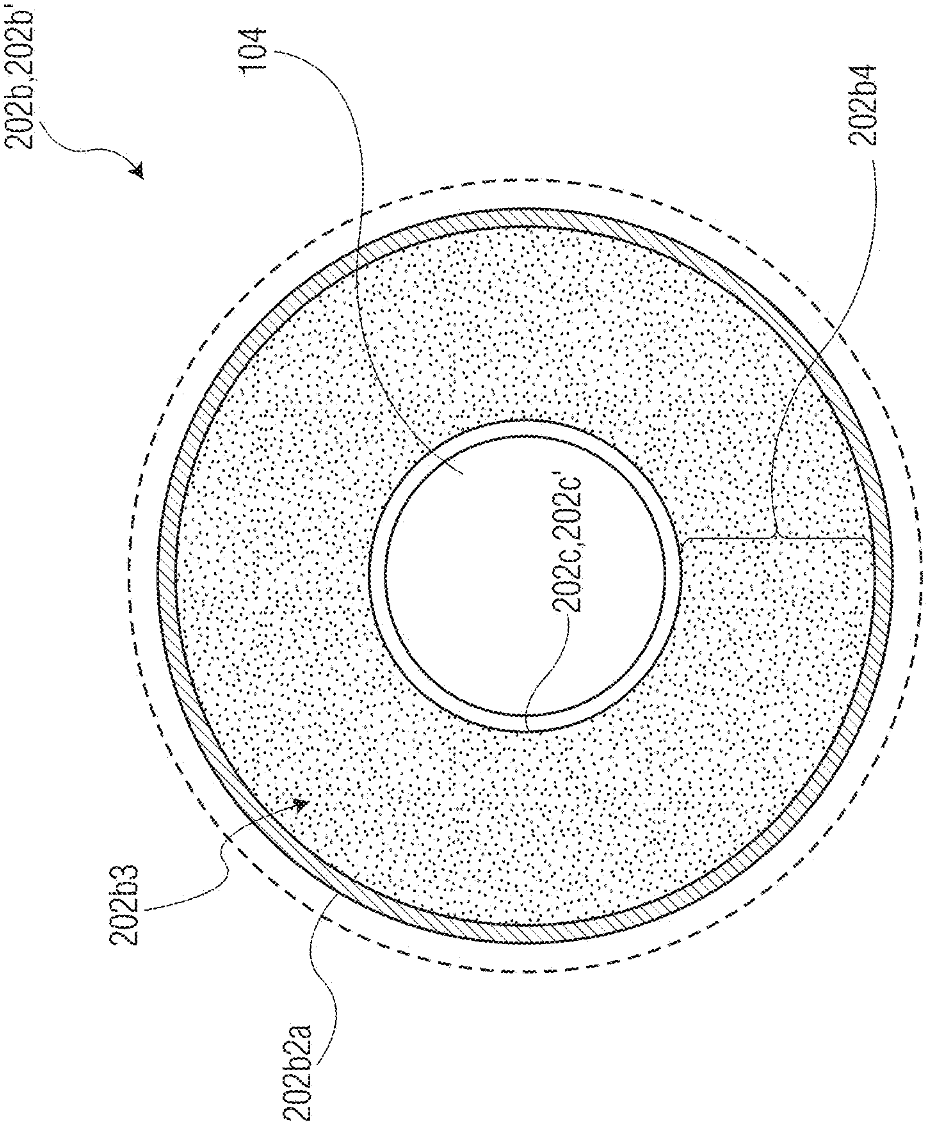

FIGS. 2C-2D illustrate, respectively, working surfaces that may be disposed on embodiments of sonotrode 200 and/or sonotrode 200', namely a working surface 202*b*1, and a working surface 202*b*3. It should be understood that certain repetitive or redundant reference numerals may be omitted for clarity.

Referring now to FIG. 2C, working surface 202*b*1 is illustrated. Working surface 202*b*1 defines annular depression 202*b*2*a* between aperture 202*c*, 202*c*' and the outer edge (e.g., edge 202*d*, 202*d*') of working surface 202*b*1. Working surface 202*b*1 includes a patterned portion 202*b*2 including a plurality of depressions 202*b*2*n*. In certain embodiments, the plurality of depressions 202*b*2*n* are a plurality of linear grooves arranged in a pattern (e.g., a grid-like pattern, a diamond shaped pattern, a "waffle"—shaped pattern, etc.).

In certain embodiments, a roughened portion may be used in lieu of (and/or in addition to) patterned portion 202*b*2. Such an embodiment is illustrated in FIG. 2D. FIG. 2D illustrates working surface 202*b*3 including a roughened portion 202*b*4. In certain embodiments, at least part of roughened portion 202*b*4 will have a surface roughness average of between: 0.01 micron and 100 microns; 0.05 micron and 5 microns; and/or 0.1 micron and 1 microns.

Referring to FIGS. 2C-2D, it should be understood that the working surfaces described are applicable to the area from annular depression 202*b*2*a* to aperture 202*c*, 202*c*'. The area radially outward from annular depression 202*b*2*a* may vary based on the particular embodiment, as indicated by the dotted circle.

Figure 3A:
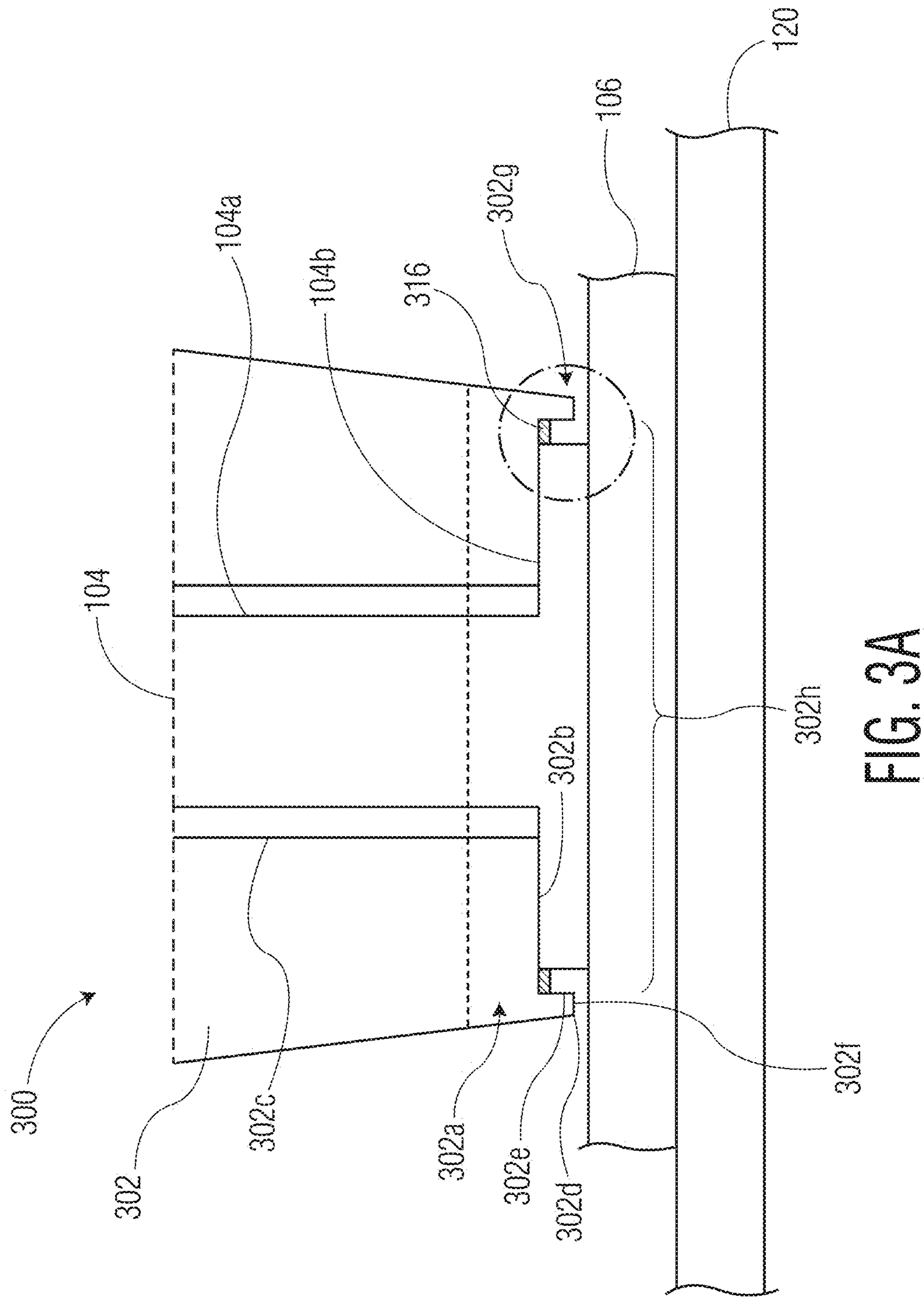
FIG. 3A is a cross-sectional block diagram side view of a portion of yet another sonotrode in connection with an ultrasonic welding operation in accordance with an exemplary embodiment of the invention.

Referring now to FIG. 3A, a portion of a sonotrode 300 configured for use in an ultrasonic welding system (e.g., ultrasonic welding system 400 of FIG. 4) is illustrated. Sonotrode 300 is similar in certain aspects to sonotrode 100, sonotrode 100', sonotrode 200, and sonotrode 200', where like elements have like reference numerals (or a reference numeral beginning with a "3" in lieu of a "1" or "2"). The description of such elements in connection with FIGS. 1A-1E and FIGS. 2A-2D is applicable to sonotrode 300 (unless explicitly or implicitly indicated otherwise) and thus omitted for conciseness.

Sonotrode 300 is configured to ultrasonically weld conductive pin 104 to workpiece 106 during a welding process (e.g., an ultrasonic welding process). Conductive pin 104 is illustrated including body portion 104*a* and head portion 104*b*. Sonotrode 300 includes a body portion 302 terminating at tip portion 302*a*, where tip portion 302*a* includes a working surface 302*b*. Tip portion 302*a* defines a peripheral wall 302*e* (e.g., an inner circumferential edge) and also defines an aperture 302*c*. Aperture 302*c* (and/or body portion 302) is configured to hold conductive pin 104 during an ultrasonic welding process.

Sonotrode 300 defines a cavity 302*h* adjacent (e.g., perpendicular to) working surface 302*b*. Cavity 302*h* is defined (at least in part) by working surface 302*b* and peripheral wall 302*e* (e.g., including one or more annular edges). Head portion 104*b* (e.g., a pin head) of conductive pin 104 can be configured to be received by cavity 302*h* (e.g., configured such that head portion 104*b* fits within the dimensions of cavity 302*h*). Tip portion 302*a* includes a circumferential portion 302*g* (e.g., a substantially annular element) radially outward from working surface 302*b*, where circumferential portion 302*g* is partially defined by peripheral wall 302*e*, an edge 302*d*, and a terminal end 302*f*. Cavity 302*h*, peripheral wall 302*e*, and/or circumferential portion 302*g* are configured to mitigate outflow of a material 316 (e.g., dislodged material from conductive pin 104, whisker-forming material, metal fragments, etc.) generated in the formation of a weld.

More specifically, circumferential portion 302*g* (including peripheral wall 302*e*) may act as a structural barrier that mitigates long whiskers. By using sonotrode 300, including circumferential portion 302*g* surrounding head portion 104*b* of conductive pin 104, whiskers may be contained.

Figure 3B:
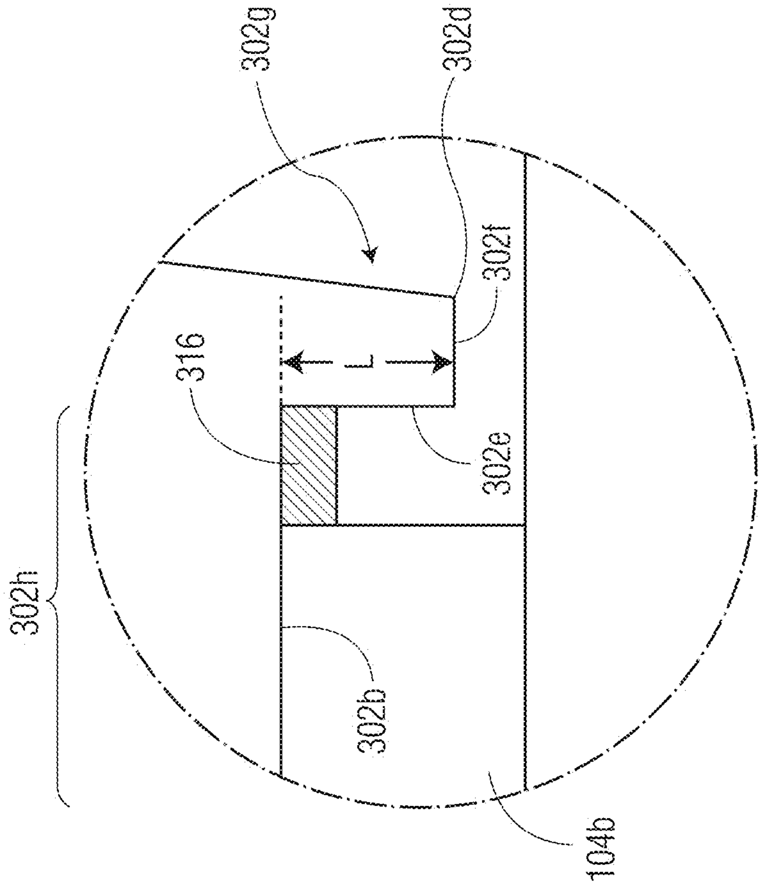
FIG. 3B is a detailed cross-sectional block diagram side view of a portion of the sonotrode of FIG. 3A.
Figure 3C:
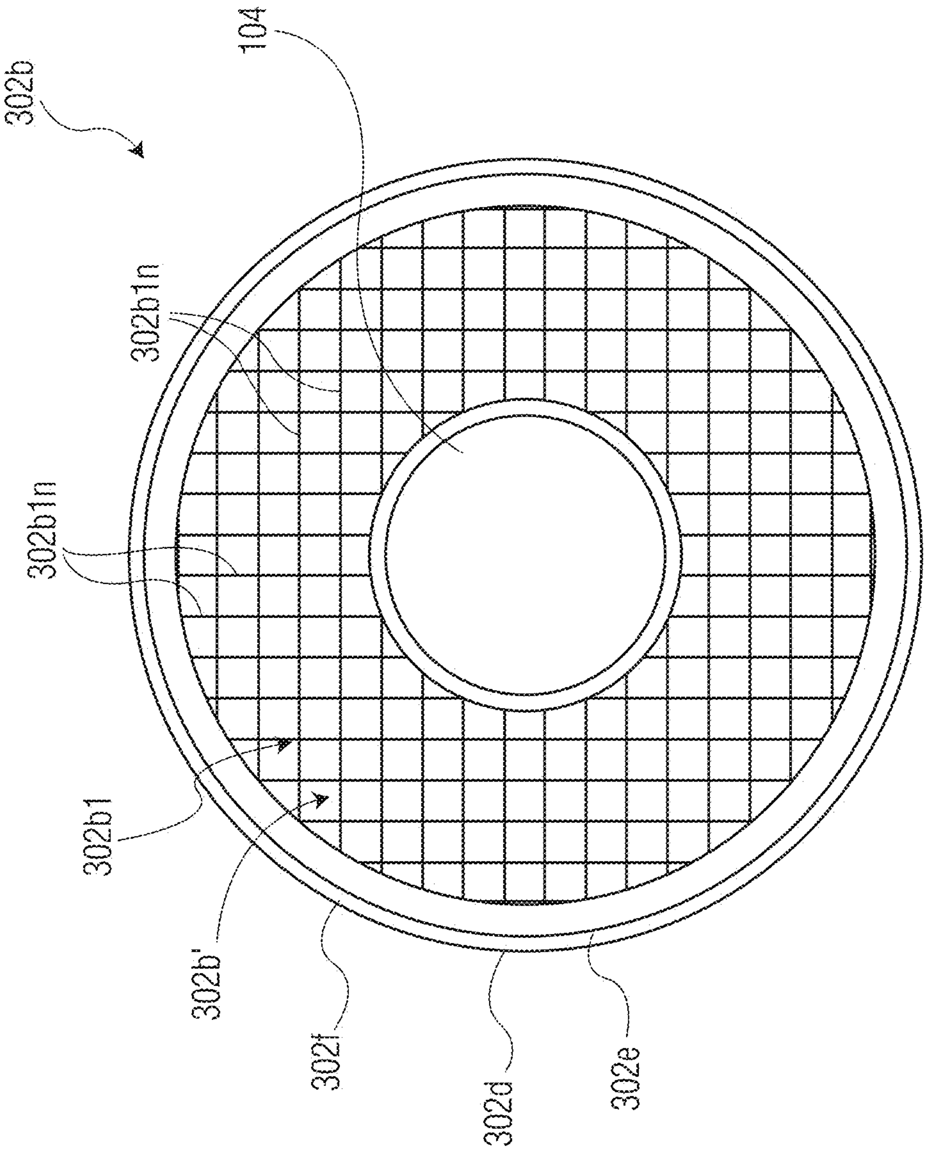
FIG. 3C is an end view of the sonotrode of FIG. 3A, including an alternative working surface, in accordance with an exemplary embodiment of the invention.

Referring now to FIG. 3B, a detailed view of a portion of sonotrode 300 is illustrated. As illustrated, cavity 302*h*, peripheral wall 302*e*, and/or circumferential portion 302*g* are configured (e.g., via the protruded length "L" from a portion of working surface 302*b*) to mitigate outflow of material 316 from a weld formed in a welding process (e.g., an ultrasonic welding process). Accordingly, in certain embodiments, working surface 302*b* can define any friction-inducing feature (e.g., in addition to, or in lieu of, a patterned portion 302*b*1 illustrated in FIG. 3C) sufficient for ultrasonic bonding operations.

Working surface 302*b* of sonotrode 300 may have any of a number of configurations (e.g., including linear depressions, patterned portions, roughened portions, smooth portions, etc.), as desired. Referring now to the example illustrated in FIG. 3C, a working surface 302*b*' (e.g., an exemplary embodiment of working surface 302*b*) of sonotrode 300 is illustrated in greater detail. Working surface 302*b*' includes patterned portion 302*b*1. In certain embodiments, working surface 302*b*' may include a plurality of depressions 302*b*1*n* (e.g., a plurality of linear grooves). The plurality of depressions 302*b*1*n* (e.g., linear grooves) can be arranged in a pattern (e.g., a grid pattern). It should be understood that the plurality of depressions 302*b*1*n* (e.g., linear grooves) may be arranged in any pattern (e.g., rectangles, diamonds, pyramids, or any other pattern). In certain embodiments, working surface 302*b* may include a roughened portion in lieu of (at least a portion) of patterned portion 302$b$1 (e.g., see roughened portion 202$b$4 of FIG. 2D).

Figure 3D:
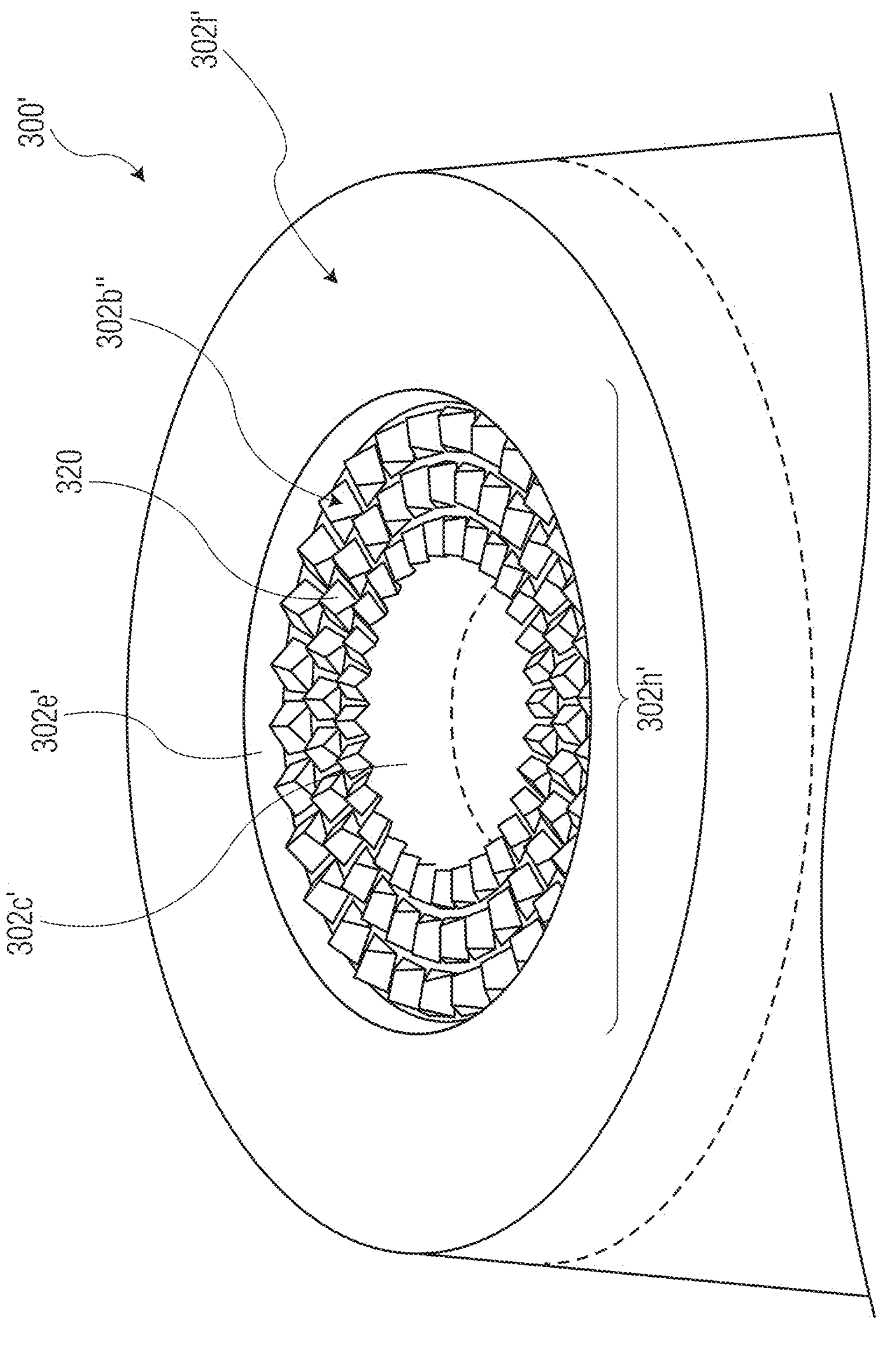
FIG. 3D is a perspective view of a tip portion of yet another sonotrode in connection with an ultrasonic welding operation in accordance with an exemplary embodiment of the invention.
Figure 3E:
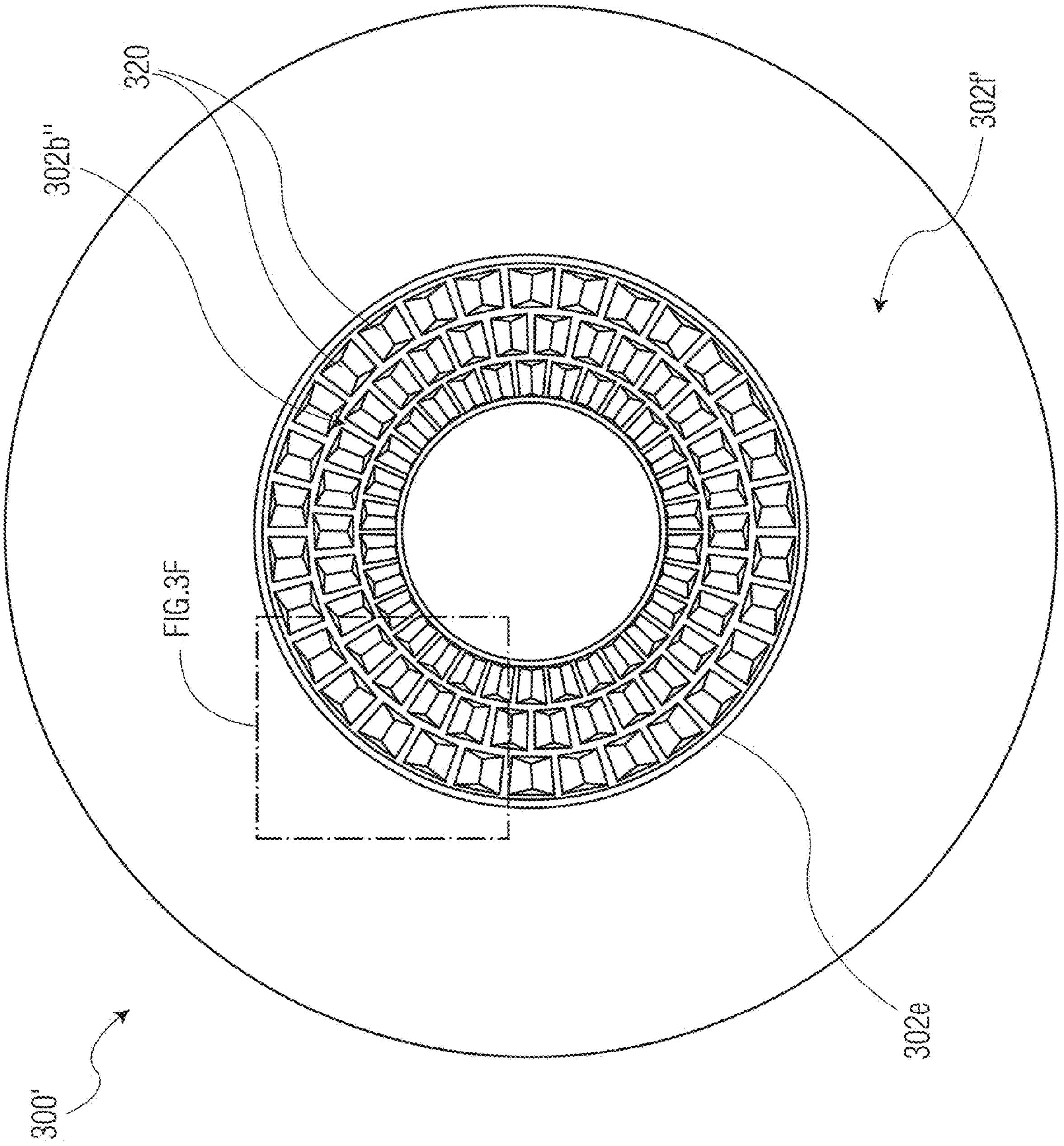
FIG. 3E is an end view of the tip portion of the sonotrode of FIG. 3D.
Figure 3F:
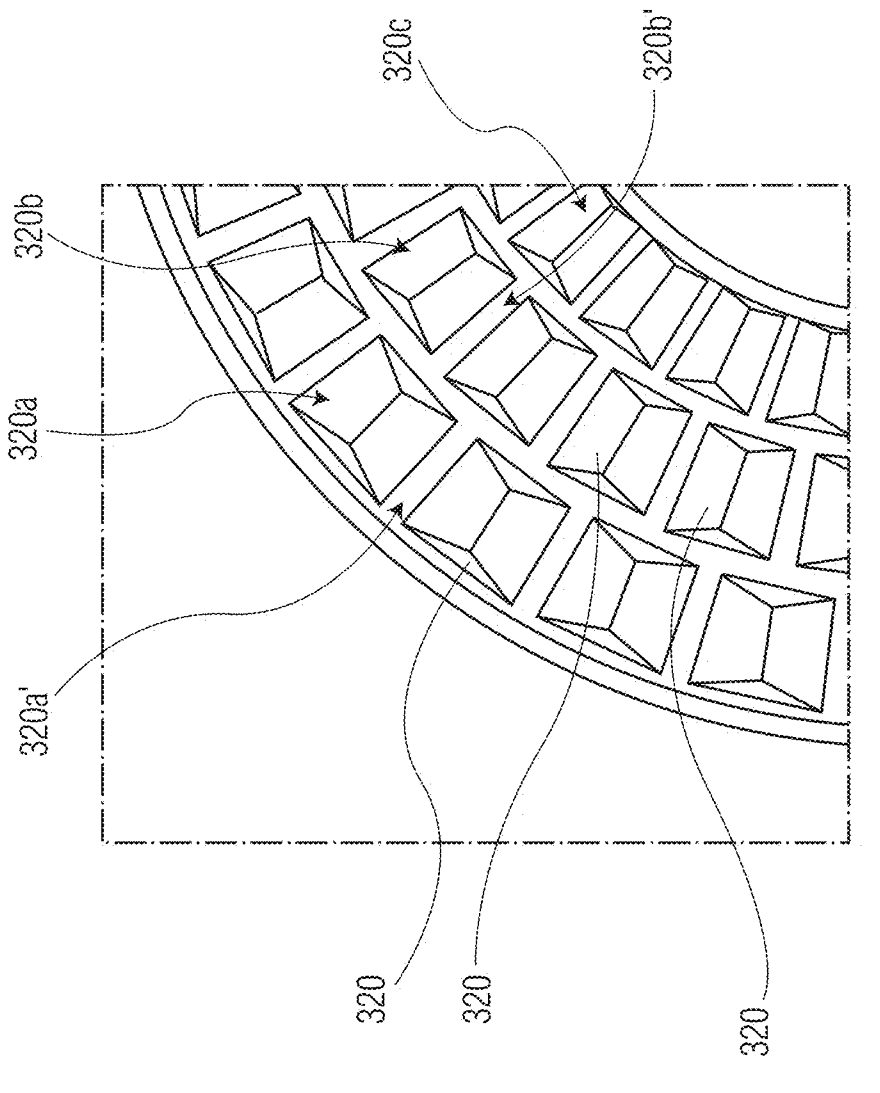
FIG. 3F is a detailed view of a portion of FIG. 3E.

Referring now to the example shown in FIGS. 3D-3F, a working surface 302$b$" (e.g., an exemplary embodiment of working surface 302$b$ of FIG. 3A) of a sonotrode 300' (e.g., an exemplary embodiment of sonotrode 300) is illustrated. Sonotrode 300' is similar in many ways to sonotrode 300, where like elements have like reference numerals. In the illustrated embodiment, a terminal end 302$f$' is noticeably larger/wider than terminal end 302$f$ of sonotrode 300, as may be useful in certain applications (e.g., to provide additional torsional strength/rigidity to sonotrode 300'). Working surface 302$b$" includes a plurality of protrusions 320 (e.g., pyramidal shaped protrusions, sawtooth shaped protrusions, or any other desired shape), along with cavities between the protrusions, disposed between a peripheral wall 302$e$' of a cavity 302$h$' and an aperture 302$c$'. The plurality of protrusions 320 may be, for example, formed using a laser (e.g., by laser scribing or the like). In the embodiment illustrated in FIGS. 3D-3F, the plurality of protrusions 320 are arranged in a plurality of concentric rings 320$a$, 320$b$, and 320$c$. Although three concentric rings 320$a$, 320$b$, and 320$c$ are illustrated, any number of concentric rings may be provided. Gaps (e.g., valleys) are illustrated between adjacent ones of the plurality of protrusions 320. As shown in FIG. 3F, gaps 320$a$' are provided between adjacent ones of the plurality of protrusions 320 in concentric ring 320$a$, while gaps 320$b$' are provided between adjacent ones of the plurality of protrusions 320 in concentric ring 320$b$, etc. Gaps 320$a$' are offset from gaps 320$b$', based on (i) the placement of the ones of the plurality of protrusions 320 in concentric ring 320$a$ versus (ii) the placement of the ones of the plurality of protrusions 320 in concentric ring 320$b$, etc. Thus, the plurality of protrusions 320 in one concentric ring (e.g., concentric ring 320$a$) are offset from those in an adjacent concentric ring (e.g., concentric ring 320$b$).

Further, according to certain embodiments of the invention (including that shown in FIGS. 3D-3F), the size of each of the plurality of protrusions 320 may be larger the farther away they are from a center of working surface 302$b$" (e.g., away from aperture 302$c$'). Referring to FIGS. 3D-3F, the plurality of protrusions 320 in concentric ring 320$b$ are larger than those in concentric ring 320$c$, and the plurality of protrusions 320 in concentric ring 320$a$ are larger than those in concentric ring 320$b$.

Figure 3G:
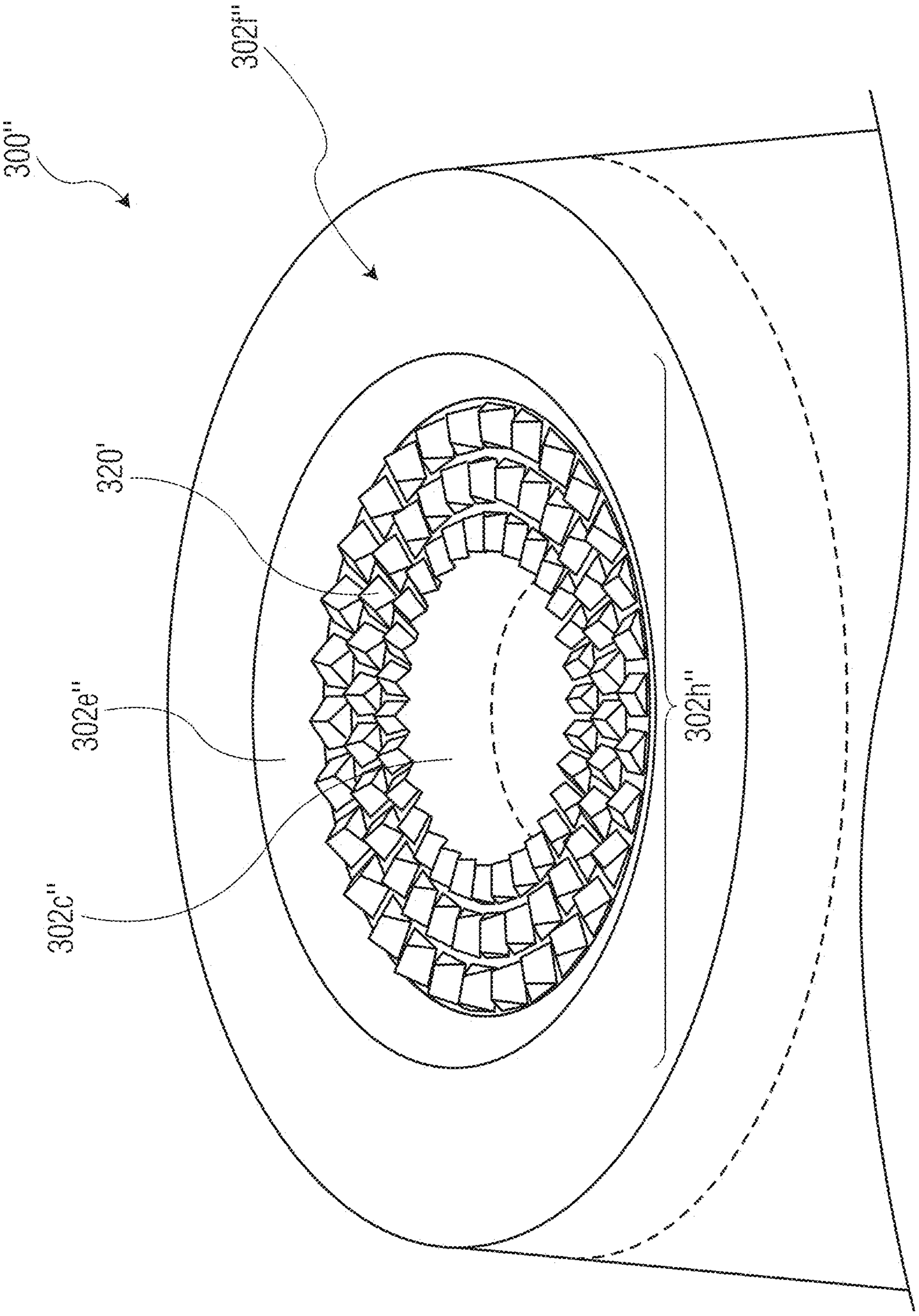
FIG. 3G is a perspective view of a tip portion of yet another sonotrode in connection with an ultrasonic welding operation in accordance with an exemplary embodiment of the invention.
Figure 3H:
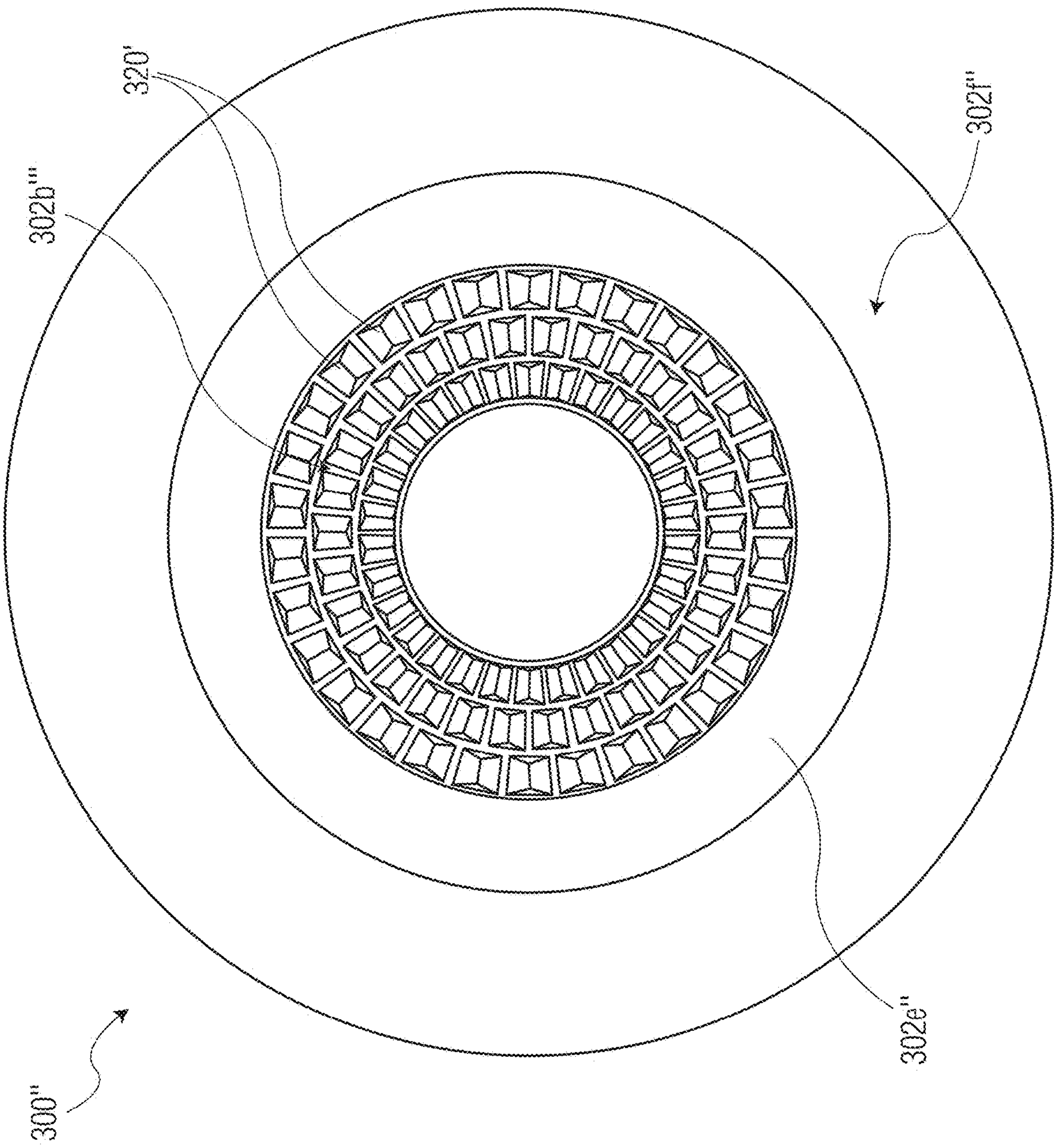
FIG. 3H is an end view of the tip portion of the sonotrode of FIG. 3G.

Referring now to FIGS. 3G-3H, a portion of a sonotrode 300" is illustrated. Sonotrode 300" is substantially similar to sonotrode 300', except a peripheral wall 302$e$"(e.g., a chamfered wall) is used in lieu of peripheral wall 302$e$', where peripheral wall 302$e$" is angled (e.g., chamfered, tapered, etc.). Due to the angle of peripheral wall 302$e$", a terminal end 302$f$" of sonotrode 300" has a smaller area than that of terminal end 302$f$' of sonotrode 300'. Peripheral wall 302$e$" (e.g. chamfered wall) may be configured to align a conductive pin (e.g., conductive pin 104) with respect to an aperture 302$c$" in connection with an ultrasonic welding process (e.g., the pin may become aligned through engagement with the peripheral wall in the presence of vacuum in the sonotrode). Sonotrode 300" is illustrated including a plurality of protrusions 320' disposed between peripheral wall 302$e$" of a cavity 302$h$" and aperture 302$c$". A working surface 302$b$" of sonotrode 300" is substantially similar to that of working surface 302$b$' of sonotrode 300'.

Referring now to FIG. 4, an ultrasonic welding system 400 is illustrated. Ultrasonic welding system 400 includes support structure 120 configured for supporting workpiece(s) 106. Ultrasonic welding system 400 is illustrated including an input workpiece supply 106$a$ (e.g., a carrier such as a magazine handler for carrying a plurality of workpieces) configured to carry and/or supply one or more workpieces 106, an output workpiece supply 106$b$ for receiving one or more workpieces 106, and a material handling system 430 configured to move workpieces 106 between input workpiece supply 106$a$ and output workpiece supply 106$b$.

Ultrasonic welding system 400 can include a vacuum 426 (including vacuum piping 426$a$) to withdraw conductive pin 104 from a conductive pin supply (not illustrated). It should be understood that alternative conductive pin handling configurations (e.g., using a gripping mechanism, a magnetic handling mechanism, etc.) are contemplated within the scope of the invention. In certain applications, a camera 428 can be used to position the ultrasonic welding system 400 in connection with a pick-up or placement operation of conductive pin 104.

Ultrasonic welding system 400 includes a weld head assembly 418 configured to move along the x-axis, y-axis, z-axis, and/or a theta axis (Ø-axis) of ultrasonic welding system 400. It should be understood that not all of these motion axes are required in each application. Weld head assembly 418 includes an ultrasonic converter 422 configured to carry a sonotrode. More specifically, ultrasonic welding system 400 utilizes a sonotrode including a body portion terminating at a working surface, where the working surface defines an aperture configured to hold a conductive pin during an ultrasonic welding process.

The sonotrode included in ultrasonic welding system 400 may be any sonotrode within the scope of the invention, including but not limited to sonotrode 100 (e.g., sonotrode 100'), sonotrode 200 (e.g., 200'), sonotrode 300 (e.g., 300', 300"), and/or any other sonotrode configured for use in ultrasonic welding system 400.

It should be understood that a control system 424 can be programmed to implement a welding operation in connection with a given sonotrode used in a particular welding operation. For example, a specific USG, amplitude, frequency, and/or motion profile can be used for a particular sonotrode.

Various embodiments of the invention described herein include linear depressions (e.g., linear depressions such as in FIGS. 1C-1E, 2C, and 3C). A depth of such linear depressions may be, for example, between: 1-1000 micrometers; 20-500 micrometers; or 50-100 micrometers; etc. A width of such linear depressions may be, for example, between: 1-2000 micrometers; 20-1000 micrometers; or 50-200 micrometers; etc.

Various embodiments of the invention described herein include an annular depression (e.g., annular depressions such as in FIGS. 1D, 2A, 2B, 2C, 2D). A depth of such annular depressions may be, for example, between: 1-1500 micrometers; 20-600 micrometers; or 50-200 micrometers; etc. A width of such annular depressions may be, for example, between: 1-2000 micrometers; 20-1000 micrometers; or 50-300 micrometers; etc.

Various embodiments of the invention include a chamfered portion included as part of the tip portion (e.g., chamfered portions, peripheral walls, etc.). The chamfered portion defines an angle with respect to a horizontal plane of a working surface. Exemplary ranges for the angle of the chamfered portions (and angled peripheral walls) may be, for example, between: 20°-70°; 30°-60°; and 40°-50°. A given range may be selected based on the application, such as an application requiring alignment of the sonotrode with respect to the conductive pin.

Various sonotrodes within the scope of the invention (including many of those described herein) include a body portion terminating at a tip portion. The body portion and the tip portion may be formed from a unitary piece of material (e.g., steel, stainless steel, a metal alloy, etc.). Alternatively, the body portion and the tip portion may be separate pieces coupled together (e.g., through brazing or other techniques) (e.g., see the dotted line separating the relevant body portion and tip portion in each of FIGS. 1A, 1B, 2A, 2B, and 3A). In connection with embodiments where the body portion and the tip portion are separate pieces, examples of the material of the body portion include: steel; stainless steel; a metal alloy; etc., and examples of materials of the tip portion include: ceramic; steel; carbide materials; and/or a metal alloy.

Aspects of the invention relate to the inclusion of various features at the tip portion of a sonotrode (e.g., linear depressions, annular depressions, protrusions, etc.). These features may be formed in the tip portion using any of a number of techniques such as laser scribing, laser irradiation, electro-discharge machining, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A sonotrode configured for use in an ultrasonic welding system comprising:

a body portion terminating at a tip portion, the tip portion including a working surface, the working surface defining an aperture configured to hold a conductive pin during an ultrasonic welding process, the working surface also defining a plurality of linear depressions, each of the plurality of linear depressions following a path that does not intersect the aperture, wherein the working surface further defines an annular depression between the aperture and an edge of the working surface.

2. The sonotrode of claim 1 wherein each of the plurality of linear depressions extends across the working surface.

3. The sonotrode of claim 1 wherein the plurality of linear depressions collectively define a star shaped pattern.

4. The sonotrode of claim 1 wherein the working surface includes a smooth portion, and wherein the plurality of linear depressions are disposed around a peripheral portion of the working surface.

5. The sonotrode of claim 1 wherein the body portion and the tip portion are formed from a unitary piece of material.

6. The sonotrode of claim 1 wherein the tip portion includes a chamfered portion between the working surface and a terminal end of the sonotrode.

7. The sonotrode of claim 6 wherein the chamfered portion is configured to align the conductive pin with respect to the aperture in connection with the ultrasonic welding process.

8. The sonotrode of claim 1 wherein the plurality of linear depressions collectively define a plurality of V-shaped patterns around a peripheral portion of the working surface.

9. The sonotrode of claim 1 wherein the body portion and the tip portion are separate pieces coupled together.

10. An ultrasonic welding system comprising:

a support structure configured for supporting a workpiece; and a weld head assembly including an ultrasonic converter carrying a sonotrode configured for use in the ultrasonic welding system, the sonotrode including a body portion terminating at a tip portion, the tip portion including a working surface defining an aperture configured to hold a conductive pin during an ultrasonic welding process, the working surface also defining a plurality of linear depressions, each of the plurality of linear depressions following a path that does not intersect the aperture, wherein the working surface further defines an annular depression between the aperture and an edge of the working surface.

11. The ultrasonic welding system of claim 10 wherein each of the plurality of linear depressions extends across the working surface.

12. The ultrasonic welding system of claim 10 wherein the plurality of linear depressions collectively define a star shaped pattern.

13. The ultrasonic welding system of claim 10 wherein the plurality of linear depressions collectively define a plurality of V-shaped patterns around a peripheral portion of the working surface.

14. The ultrasonic welding system of claim 10 wherein the working surface includes a smooth portion, and wherein the plurality of linear depressions are disposed around a peripheral portion of the working surface.

15. The ultrasonic welding system of claim 10 wherein the body portion and the tip portion are formed from a unitary piece of material.

16. The ultrasonic welding system of claim 10 wherein the body portion and the tip portion are separate pieces coupled together.

17. The ultrasonic welding system of claim 10 wherein the tip portion includes a chamfered portion between the working surface and a terminal end of the sonotrode.

18. The ultrasonic welding system of claim 17 wherein the chamfered portion is configured to align the conductive pin with respect to the aperture in connection with the ultrasonic welding process.

19. The sonotrode of claim 1 wherein the annular depression is configured to capture excess welding material during welding of the conductive pin during the ultrasonic welding process.

20. The ultrasonic welding system of claim 10 wherein the annular depression is configured to capture excess welding material during welding of the conductive pin during the ultrasonic welding process.

* * * * *